June 17, 1969 P. S. SKULLESTAD 3,451,005

NEGATIVE RESISTANCE AMPLIFIER ARRANGEMENT AND METHOD THEREFOR

Filed May 5, 1966

INVENTOR
PER S. SKULLESTAD
BY
Flehr and Swain
ATTORNEYS

United States Patent Office 3,451,005

Patented June 17, 1969

3,451,005

NEGATIVE RESISTANCE AMPLIFIER ARRANGEMENT AND METHOD THEREFOR

Per S. Skullestad, Sunnyvale, Calif., assignor to International Telephone and Telegraph Corporation, Nutley, N.J., a corporation of Delaware Filed May 5, 1966, Ser. No. 547,808
Int. Cl. H03f 3/60, 15/00
U.S. Cl. 330—61 2 Claims

ABSTRACT OF THE DISCLOSURE

Improved circuit arrangement for amplifying in the microwave frequency region. The arrangement employs tunnel diode amplifiers in combination with directional filters and a hybrid. The entire arrangement utilizes stripline channels.

The present invention is directed to a negative resistance amplifier arrangement and method of providing negative resistance amplification, and more specifically to an arrangement and method which provides improved coupling between negative resistance amplifier components and associated input and output circuits.

With a two terminal negative resistance amplifier, such as a tunnel diode, it is necessary to provide auxiliary means to prevent feed-back between the input and output circuits associated with the amplifier. One solution in the past has been the use of multiport circulators which have the characteristic of passing energy in one direction but not in the other. With this type of arrangement, it is usually necessary to use a five port circulator arrangement in cases where high gains circulators is somewhat limited; in other words, the circulator does have some feed-back.

The use of a hybrid coupled tunnel diode amplifier using two matched tunnel diodes has also been suggested as a method of isolating the input circuits from the output circuits. This is unsatisfactory because of the critical impedance matching required between the hybrid and the input and output circuits.

It is a general object of this invention to provide an improved negative resistance amplifier arrangement and method therefor of amplification.

It is another object of the invention to provide a negative resistance amplifier arrangement and method therefor which is independent of variations in load or source impedance outside the immediate frequency band of interest.

It is a further object of the invention to provide an improved negative resistance amplifier arrangement and method therefor which is simple and inexpensive.

Other objects and features of the invention will be apparent from the accompanying drawing and the following description.

Referring to the drawing.

Figure 1:
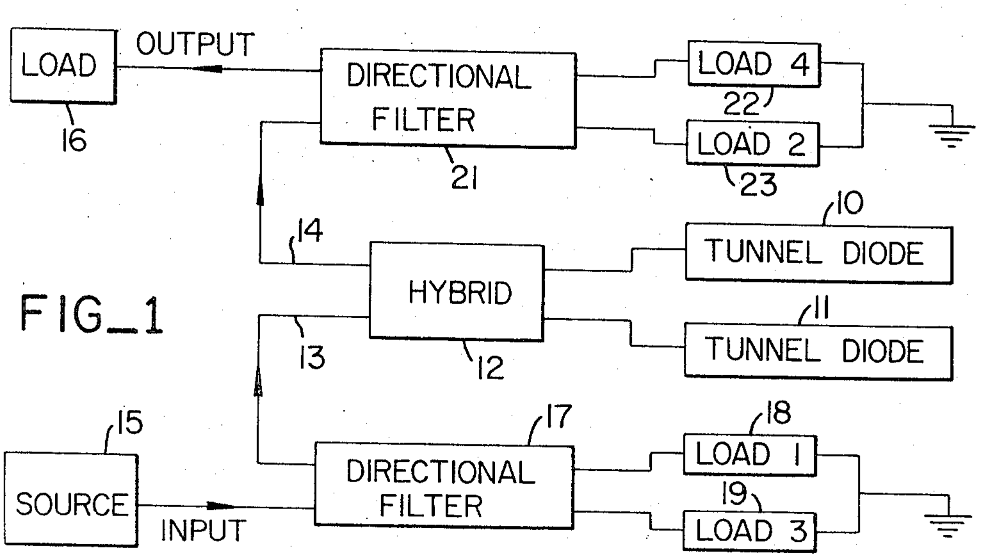
FIGURE 1 is a block diagram embodying the novel negative resistance amplifier arrangement and method therefor of the present invention.

As illustrated in FIGURE 1, a matched pair of tunnel diodes 10 and 11 are coupled to a hybrid circuit 12. The hybrid is of the three decibel type and includes an input channel 13, which is coupled to a source 15 of input signal energy, and an output channel 14 which couples the amplified input signal to a load 16. More specifically, input channel 13 is coupled to a directional filter 17, the details of which will be described in connection with FIGURE 2. The input signal would normally consist of a predetermined band of frequencies. The directional filter is in turn coupled to loads 18 and 19 which are terminated to ground and which serve to terminate all frequencies other than those of the input signal of the amplifier.

Similarly, output channel 14 is coupled to a directional filter 21 which is coupled to load 16 and terminated with loads 22 and 23. Again, these terminating loads are for the purpose of terminating frequencies other than the input signal.

Figure 2:
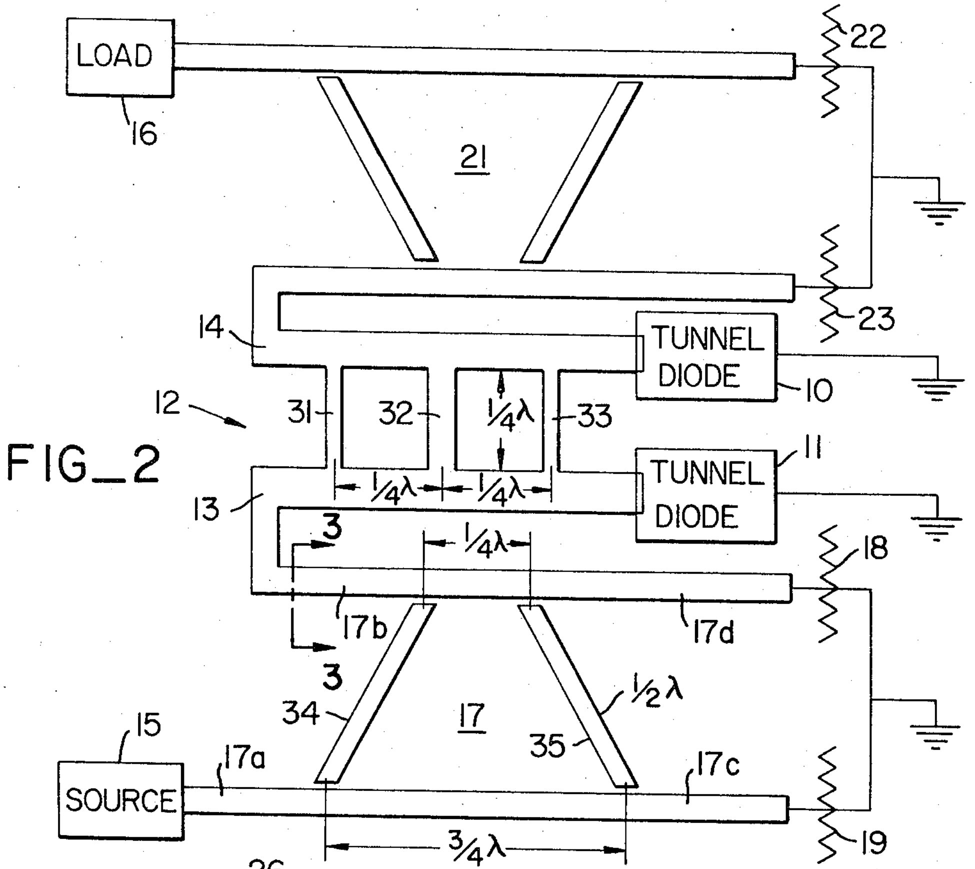
FIGURE 2 is a schematic circuit diagram of FIGURE 1.
Figure 3:
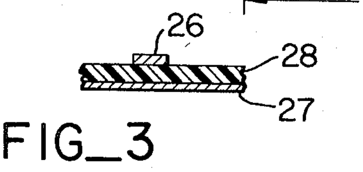
FIGURE 3 is an enlarged sectional view taken along line 3—3 of FIGURE 2.

Hybrid 12 and the associated directional filters 17 and 21 are shown in greater detail in FIGURE 2 in stripline form. FIGURE 3 is a typyical cross section showing a metal strip 26 spaced from a conductive ground plane 27 by a dielectric sheet 28.

Hybrid 12 includes the input channel 13 and output channel 14. Tunnel diode 10 is indicated schematically as located at the end of channel 14, and tunnel diode 11 at the end of channel 13. Branches 31, 32 and 33 provide communication between the channels 13 and 14 and divide the input signal energy from channel 13 equally between tunnel diodes 10 and 11. The split signal couples to both tunnel diodes, 10, 11, is amplified and thereafter propagated outwardly on both channels 13 and 14. The coupling of power is controlled by the length and impedance of the branches, the dividing of power occurring in the same manner as two equal resistors connected in parallel. As in the case with the input signal energy, the output signal energy from each diode is split between the two channels. But, because of the phase differences caused by the locations of branches 31, 32 and 33, as indicated, the portion of the output signal energy of tunnel diode 10, which is split into channel 13, is of an opposite phase to the output signal energy of tunnel diode 11 which is propagating down the channel 13. The wavelength indicated is that of the center frequency of the frequency band of the input signal. Thus, these two signal waves cancel each other to eliminate any output energy on channel 13. Conversely, the output signals on channel 14 are in phase and combine and couple to load 16 through directional filter 21. More particularly, the input signal, in going from channel 13 to channel 14 lags by $\frac{1}{4}\lambda$. Similarly, the output of diode 10, in going from channel 14 to channel 13 lags by another $\frac{1}{4}\lambda$ for a total lag of $\frac{1}{2}\lambda$ thereby constituting a lag of 180°. Thus, the signal going from tunnel diode 10 to channel 13 lags the output of tunnel diode 11 by 180° and cancels it out. The output signal of tunnel diode 11, on the other hand, in going from channel 13 to channel 14 lags by $\frac{1}{4}\lambda$ and thus is in phase with the output of diode 10 that also has a $\frac{1}{4}\lambda$ lag.

Directional filters 21 and 17 are identical in construction, and, as illustrated in the drawing, are of a stripline or parallel plate construction.

Referring to directional filter 17, the filter has four separate arms. An input arm **17*a* is coupled to source 15, and an output arm 17*b* coupled to channel 13. In addition, there are terminating arms 17*c* and 17*d* which are associated with input arm 17*a* and output arm 17*b*, respectively, and resistive terminations 19 and 18, respectively. The filter also includes resonators 34 and 35 which are resonant at the signal frequency and which are coupled to the stripline pairs 17*a*, 17*c* and 17*b*, 17*d* at points separated by an odd number of quarter wavelengths, as indicated. As shown in the drawing, strip line 17*a*, 17*c* couples to the resonators at points spaced three-quarters of a wavelength at the center frequency of the input signal, and stripline 17*b*, 17*d* couples to resonators 34 and 35** at two points spaced one-quarter of a wavelength. Each resonator is one-half wavelength long. The spatial relationships provide the directional characteristics of the filter.

Although the present invention is embodied in a specific type of stripline construction, other forms of such construction may be used; for example, a conductive strip sandwiched between two dielectric layers. Also, for higher frequencies, waveguides may be substituted.

In operation, an incoming signal from source 15 is evenly split between resonators 34 and 35, and again combines, in phase, on arm 17*b*. Arm 17*d* has no output of the signal frequencies since the split signal frequencies are 180° out of phase at this point and thereby cancel. Directional filter 21 operates in a similar manner.

Any other frequencies which are either generated or reflected by source 15 or load 16 will not be transmitted to the other arm of the directional coupler since the resonators act as a bandpass filter and pass only frequencies within the band of the input signal. Instead, they are absorbed by resistive terminations 19 and 22. Thus, the source and load are effectively isolated from the tunnel diodes. Similarly, all extraneous frequencies which are generated in the tunnel diode amplifier sections 10, 11 (such as those produced by a non-linear amplification characteristic) are isolated from the source and load and terminated in resistive terminations 18 and 23.

In conclusion, the use of a directional filter in combination with a hybrid circuit provides for the effective coupling of a load and source to a tunnel diode arrangement without problems of oscillation and instability. Directional filters provide immunity from variations in load and source impedances which would otherwise affect the operation of the tunnel diode amplifiers, and, in addition stabilizes the integral operation of the tunnel diode amplifiers by effectively terminating all frequencies other than the input signal. Thus, the combination of the directional filters with the hybrid circuit provides a tunnel diode amplifier arrangement and method of amplification having a stability not yet achieved by the prior art with the use of relatively inexpensive components.

I claim.

1. In a negative resistance amplifier arrangement, input means for providing an input signal within a predetermined frequency band, a pair of negative resistance amplifiers for amplifying said signal, output means for utilizing said amplified signal, stripline hybrid coupling means including an input stripline channel and an output stripline channel coupled respectively to each of said amplifiers, said input and output striplines being shunted by paralleled striplines of a predetermined spacing and resistance for dividing the input signal on said input channel between said amplifiers and for coupling the amplified signals in phase on said output stripline and coupling said amplified signals out of phase on said input stripline for combining the resultant amplified signals on said output channel and for preventing adverse feedback, stripline means for coupling said input channel to said input means including bandpass filter means comprising sections of stripline resonant at a frequency within said predetermined frequency band for passing only frequencies within said band, said resonant sections having a predetermined spacing corresponding to a wavelength within said band for directionally coupling only to said input signal and for terminating all frequencies outside of said predetermined frequency band, and stripline means for coupling said output channel to said output means including bandpass filter means comprising sections of stripline resonant at a frequency within said predetermined frequency band for passing only frequencies within said band, said resonant sections having a predetermined spacing corresponding to a wavelength within said band for directionally coupling only to said output signal and for terminating all frequencies outside of said predetermined frequency band.

2. In the negative resistance amplifier arrangement of claim 1 wherein said hybrid coupling means includes three parallel striplines spaced apart from each other by one quarter lambda, and maintaining said input stripline channel to said output strip channel spaced apart by one quarter lambda.

References Cited

UNITED STATES PATENTS

| | | | |
|---|---|---|---|
| 3,208,003 | 9/1965 | Sterzer | 330—61 |
| 3,219,842 | 11/1965 | Greunke et al. | 307—222 X |
| 3,293,447 | 12/1966 | Fleming | 307—222 X |
| 3,300,730 | 1/1967 | Gabriel | 330—61 |
| 3,316,421 | 4/1967 | Biard | 307—88.3 |

FOREIGN PATENTS 680,490 2/1964 Canada.

NATHAN KAUFMAN, *Primary Examiner.*

U.S. Cl. X.R.

330—53; 307—322